(12) United States Patent
Ettinger et al.

(10) Patent No.: US 11,539,271 B2
(45) Date of Patent: Dec. 27, 2022

(54) METHOD FOR CONTACTLESSLY DETERMINING THE POSITION OF A DRIVEN ROTOR OF AN ELECTRIC MOTOR, ELECTRIC MOTOR, AND PIPETTING SYSTEM FOR ASPIRATING AND DISPENSING PIPETTING LIQUID HAVING SUCH AN ELECTRIC MOTOR

(71) Applicant: HAMILTON BONADUZ AG, Bonaduz (CH)

(72) Inventors: Reto Ettinger, Uster (CH); Jürg Rast, Schmerikon (CH); Fridolin Gysel, Adliswil (CH)

(73) Assignee: HAMILTON BONADUZ AG, Bonaduz (CH)

( * ) Notice: Subject to any disclaimer, the term of this patent is extended or adjusted under 35 U.S.C. 154(b) by 364 days.

(21) Appl. No.: 16/612,638

(22) PCT Filed: May 3, 2018

(86) PCT No.: PCT/EP2018/061403
§ 371 (c)(1),
(2) Date: Nov. 11, 2019

(87) PCT Pub. No.: WO2018/206404
PCT Pub. Date: Nov. 15, 2018

(65) Prior Publication Data
US 2020/0076275 A1 Mar. 5, 2020

(30) Foreign Application Priority Data
May 12, 2017 (DE) .......................... 102017110388.0

(51) Int. Cl.
*H02K 11/215* (2016.01)
*H02K 41/03* (2006.01)
(Continued)

(52) U.S. Cl.
CPC .......... *H02K 11/215* (2016.01); *B01L 3/0227* (2013.01); *G01D 5/145* (2013.01);
(Continued)

(58) Field of Classification Search
CPC .. H02K 11/215; H02K 41/031; B01L 3/0227; B01L 2400/043; G01D 5/145; G01R 33/0094; G01R 33/072
See application file for complete search history.

(56) References Cited

U.S. PATENT DOCUMENTS 4,298,575 A * 11/1981 Berglund .............. B01L 3/0227
422/926
6,316,848 B1 * 11/2001 Rohner .................. H02K 29/08
310/12.21

(Continued)

FOREIGN PATENT DOCUMENTS

CN          1328645 A    12/2001
CN        101228454 A     7/2008
(Continued)

OTHER PUBLICATIONS

Sysel, P. et el. "Goertzel algorithm generalized to non-integer multiples of fundamental frequency", 2012, EURASP Journal on Advances in Signal Processing, 56, pp. 1-8.

*Primary Examiner* — Bernard Rojas
(74) *Attorney, Agent, or Firm* — Wiggin and Dana LLP (57) ABSTRACT

There is provided a method for contactless determination of the position of a driven moving portion (4) of an electric motor (2) by means of a plurality of magnetic field sensors (8), wherein the moving portion is movably arranged with respect to a stator (6) and has a plurality of permanent magnets (40) which generate a moving-portion magnetic field having a plurality of periodically spaced apart maxima, and wherein the plurality of magnetic field sensors are arranged along a movement path (43) of the moving portion.

(Continued)

The method comprises the following steps: by means of the plurality of magnetic field sensors, determining a plurality of measured values (70) for a momentary magnetic field that is generated by the plurality of permanent magnets and dependent on the position of the moving portion, determining a specific spectral signal component (74) from the plurality of measured values (70), the specific spectral signal component having the spatial frequency corresponding to the distance between adjacent like maxima of the moving-portion magnetic field, and determining the position of the driven moving portion by means of the specific spectral signal component.

18 Claims, 6 Drawing Sheets

(51) Int. Cl.
  *B01L 3/02* (2006.01)
  *G01D 5/14* (2006.01)
  *G01R 33/00* (2006.01)
  *G01R 33/07* (2006.01)

(52) U.S. Cl.
  CPC ....... *G01R 33/0094* (2013.01); *G01R 33/072* (2013.01); *H02K 41/031* (2013.01); *B01L 2400/043* (2013.01)

(56) References Cited

U.S. PATENT DOCUMENTS

| | | | |
|---|---|---|---|
| 7,539,549 | B1 | 5/2009 | Discenzo et al. |
| 9,243,933 | B2 | 1/2016 | Lehmann et al. |
| 11,031,849 | B2* | 6/2021 | Brierley ............... H02K 1/2793 |
| 2002/0188410 | A1* | 12/2002 | Salje ..................... B01L 3/0227 |
| | | | 702/50 |
| 2005/0211880 | A1* | 9/2005 | Schell .................... H03F 3/087 |
| | | | 250/214 A |
| 2010/0072830 | A1 | 3/2010 | Ausderau |
| 2013/0001242 | A1* | 1/2013 | Hofstetter ............. F04B 7/0015 |
| | | | 222/1 |
| 2014/0203801 | A1 | 7/2014 | Lehmann et al. |
| 2015/0022030 | A1 | 1/2015 | Rohner et al. |

FOREIGN PATENT DOCUMENTS

| | | |
|---|---|---|
| DE | 4141000 A1 | 6/1992 |
| DE | 102008060840 A1 | 6/2010 |
| DE | 202010003659 U1 | 7/2010 |
| EP | 1978633 A2 | 8/2008 |
| EP | 2169356 A1 | 3/2010 |
| JP | 2001-190520 A | 7/2001 |
| WO | 2011083125 A1 | 7/2011 |
| WO | 2017017084 A1 | 2/2017 |

* cited by examiner

METHOD FOR CONTACTLESSLY DETERMINING THE POSITION OF A DRIVEN ROTOR OF AN ELECTRIC MOTOR, ELECTRIC MOTOR, AND PIPETTING SYSTEM FOR ASPIRATING AND DISPENSING PIPETTING LIQUID HAVING SUCH AN ELECTRIC MOTOR

FIELD

The present invention pertains to the field of electric motors. In particular, the present invention relates to determining the position of a moving portion of an electric motor. More particularly, the present invention is in the field of pipetting systems driven by electric motors.

BACKGROUND

Pipetting systems are an example of technical systems in which a moving element, often a movable piston, is moved with high precision. In a pipetting system, pipetting liquid is aspirated and dispensed, respectively, through a pipetting tip by the movement of the piston. For many applications, especially in the field of laboratory automation, the releasing and taking up of liquid, i.e. dispensing and aspirating of liquid, has to be done very accurately. This results in the general endeavor to perform as exact movements as possible with the piston. Thus, when the piston is driven by means of an electric motor, exact movements of the moving portion of the electric motor are desirable. In the prior art, there are approaches to determine the position of the piston in a pipetting system and to control the electric motor accordingly. However, such prior systems involving position determination are not satisfactory. Also in many other technical fields there are technical systems in which a component driven by an electric motor should be moved exactly.

SUMMARY

Accordingly, it would be desirable to provide an improved method of position determination, an improved electric motor, and an improved pipetting system.

Exemplary embodiments of the invention comprise a method for contactless determination of the position of a driven moving portion of an electric motor by means of a plurality of magnetic field sensors, wherein the moving portion is movably arranged with respect to a stator and has a plurality of permanent magnets which generate a moving-portion magnetic field having a plurality of periodically spaced apart maxima, and wherein the plurality of magnetic field sensors are arranged along a movement path of the moving portion. The method comprises the following steps: by means of the plurality of magnetic field sensors, determining a plurality of measured values for a momentary magnetic field which is generated by the plurality of permanent magnets and dependent on the position of the moving portion; determining a specific spectral signal component from the plurality of measured values, the specific spectral signal component having the spatial frequency corresponding to the distance between adjacent like maxima of the moving-portion magnetic field; and determining the position of the driven moving portion by means of the specific spectral signal component.

Exemplary embodiments of the invention allow for a direct and efficient position determination of the moving portion of the electric motor, i.e. a position determination directly at the source of the movement. Due to the contactless determination of the position of the moving portion, there is no additional load in the form of an additional driven mass acting on the electric motor. In comparison with previous approaches, in which the moving portion of the electric motor or a downstream driven component mechanically actuates a sensor, the contactless determination of the position can support larger dynamics, prevent component wear and render the overall system more robust.

The method can use the permanent magnets, which are present anyway for driving the moving portion, for the contactless position determination of the moving portion. In this regard, the fact is used that the magnetic field generated by the permanent magnets is not only used as basis for the movement of the moving portion, but is also present measurably along the movement path of the moving portion. The magnetic field generated by the permanent magnets forms the basis for determining the position of the moving portion. However, it is also possible that there are permanent magnets present serving solely for determining the position and provided in addition to the drive magnets, with the magnetic field thereof being measured and used for the position determination. In this case, the additional permanent magnets are also drivingly connected to the moving portion, and the magnetic field sensors are arranged along the movement path of the additional permanent magnets.

The plurality of permanent magnets are arranged in the moving portion such that a moving-portion magnetic field is formed with a plurality of periodically spaced maxima. The expression moving-portion magnetic field refers to the magnetic field that is present in the reference system of the moving portion and is static in this system by the fixed arrangement of the permanent magnets. The maxima are local maxima, i.e. in comparison with the direct environment, local magnetic south and north poles, respectively. The expression periodically spaced apart maxima makes clear that the moving-portion magnetic field has alternating south and north poles whose sequence and spacing are repetitive at least for part of the moving-portion magnetic field. Thus, the permanent magnets generate a moving-portion magnetic field with alternating south and north poles and with a strong oscillating component. The moving-portion magnetic field generates a momentary magnetic field in the reference system of the stator, with the momentary form of this magnetic field being dependent on the position of the moving portion. Since the moving-portion magnetic field has a plurality of periodically spaced apart maxima, the momentary magnetic field generated by the plurality of permanent magnets and applied to the plurality of magnetic field sensors has a strong signal component with the spatial frequency corresponding to the distance between adjacent like maxima of the moving-portion magnetic field. This signal component is referred to herein as specific spectral signal component, which is determined by means of the measured values determined by the magnetic field sensors. With this specific spectral signal component, the position of the driven moving portion is efficiently determined. The presence of a strong periodic component in the magnetic field generated by the permanent magnets and the targeted determination of the specific spectral signal component with this spatial frequency allows for a direct and efficient position determination of the moving portion of the electric motor.

The method is applicable both to linear motors and to electric motors having a rotating rotor, as well as to any other types of electric motors. In a linear motor, the moving portion has a linear movement path. The movement path of a rotor can be described by the sum of all points that a particular component of the rotor, e.g. a component adjacent to the air gap, passes during operation. Consequently, the movement path of the moving portion in an electric motor having a rotating rotor can be described as a circular path. The arrangement of the magnetic field sensors along the movement path of the moving portion may be such that the arrangement has the same geometric basic structure, i.e. for example a linear or circular arrangement, while the arrangement is offset with respect to the movement path of the moving portion. However, other arrangements are possible as well. In a linear motor, for example, the magnetic field sensors may be arranged in a spiral path around the movement path of the moving portion.

In a linear electric motor, the moving portion may comprise a plurality of bar magnets which are mounted to each other on the movement path of the moving portion, with reversed polarization each. In this case, the length of the individual permanent magnets may correspond to the distance between a local north pole and a local south pole or to half the distance between adjacent like maxima of the moving-portion magnetic field.

The plurality of permanent magnets are arranged to generate a moving-portion magnetic field having a plurality of periodically spaced apart maxima. It is neither necessary that the periodically spaced apart maxima have magnetic field values of equal amounts, nor that all maxima are evenly spaced. For example, it is possible for the moving-portion magnetic field to fray toward its ends, so that there are other distances resulting there between maxima than in the middle of the moving-portion magnetic field. What is important is that the moving-portion magnetic field has a plurality of uniformly spaced apart maxima. The distance between two maxima of the moving-portion magnetic field can also be referred to as pole distance or pitch. The pole distance is related to the spatial arrangement and possibly the distances between the permanent magnets. It is understood that the distance between the maxima of the moving-portion magnetic field is not an exact distance in the geometric sense. Due to production tolerances and other inaccuracies, in particular in the positioning of the permanent magnets, the distance between the maxima of the moving-portion magnetic field can vary slightly. The distance between the plurality of periodically spaced apart maxima is a nominal distance.

The plurality of measured values are measured values measured substantially simultaneously. Thus, the plurality of measured values represent a spatial distribution of the magnetic field generated by the plurality of permanent magnets at a specific measurement time. The plurality of measured values are sampling points of the momentary magnetic field. In particular, the plurality of measured values are sampled values of the magnetic field currently present in the reference system of the stator and generated by the permanent magnets of the moving portion. This spatial distribution of the magnetic field at a particular measurement time is then analyzed with respect to the above-discussed spatial frequency of the specific spectral signal component. The spectral specific signal component is the signal component that indicates the position of the plurality of permanent magnets, because the spatial frequency thereof corresponds to the distance between adjacent like maxima of the moving-portion magnetic field. In this regard, the expression that the spatial frequency corresponds to the distance between adjacent like maxima of the moving-portion magnetic field may means that the sampling points are analyzed with regard to exactly this spatial frequency. However, it is also possible that the specific spectral signal component has a spatial frequency which takes into account the offset of the magnetic field sensors relative to the permanent magnets, in addition to the distance between adjacent like maxima. Also in this case, the spatial frequency of the specific spectral signal component corresponds to the distance between adjacent like maxima in the sense of the invention. The spatial frequency is merely matched to the geometry of the arrangement of magnetic field sensors with respect to permanent magnets. The expression measured values taken substantially simultaneously points out that the measured values as far as possible are intended to represent a snapshot of the magnetic field. However, this expression also includes that the measured values can have a certain temporal offset from one another. This may be the case, for example, when the measured values belong to a series of successive measurements, e.g. when analog magnetic field sensors are used whose outputs are applied in succession to an analog-to-digital converter, and the digitized measured data thus represent measurements at slightly different times. In general, there may be practical limitations in the signal processing chain due to which, in the specific application scenario, a complete temporal synchronization of the measured values is not possible or is not desired due to the higher complexity/parallelism.

The stator may be provided with a plurality of electromagnets by means of which the moving portion of the electric motor is driven. The electromagnets can be coils or have windings through which time-variable magnetic fields can be generated by means of suitable control.

According to a further embodiment, determining the position of the driven moving portion is performed by means of the phase angle of the specific spectral signal component. It is possible to determine by means of the phase angle how far a maximum of the magnetic field generated by the plurality of permanent magnets is spaced apart from a known position, e.g. from a position of a particular magnetic field sensor. In this way, the position of the driven moving portion can be determined in a particularly accurate and efficient manner. As compared to the determination of the position of the driven moving portion by means of the amplitude of the specific spectral signal component, the determination by means of the phase angle is more robust. The amplitude changes quite rapidly with respect to the distance between permanent magnets and magnetic field sensors, while the relative position of the maxima with respect to each other can be determined accurately and reliably also at a distance from the permanent magnets. Also, achieving a very accurate positioning of the permanent magnets may involve less effort in the production of the moving portion than keeping the magnetization of the permanent magnets within very narrow limits. Thus, the determination of the position by means of the phase angle may allow for a better compromise between efforts/complexity and accuracy.

In accordance with a further embodiment, determining the position of the driven moving portion comprises converting the phase angle of the specific spectral signal component into an offset of the driven moving portion with respect to a known position. In this regard, the known position may be known by current measured variables in conjunction with production data of the overall system. For example, the known position may be known by a determination of that magnetic field sensor that is closest to a particular point of the moving portion, in conjunction with the production data which reveal where this magnetic field sensor is arranged. Production-related deviations from the nominal positions of the magnetic field sensors can be measured and included in the calculation of the position of the driven moving portion. It is also possible that the known position is known from the control of the electromagnets of the stator. In other words, it is possible that a position of the moving portion can be estimated via the control of the electromagnets, which is regarded as a known position, and that the exact position of the moving portion is determined by the described offset on the basis of the phase angle of the specific spectral signal component.

According to a further embodiment, determining the specific spectral signal component is performed by applying the Goertzel algorithm to at least part of the plurality of measured values. The Goertzel algorithm extracts a single spectral signal component from the sampling points or from a subset of the sampling points of the momentary magnetic field. Accordingly, the specific spectral signal component can be determined without the need for a comprehensive analysis of the frequency spectrum of the signal formed by the sampling points. The Goertzel algorithm thus facilitates a very efficient, fast and resource-conserving determination of the specific spectral signal component. The Goertzel algorithm is also known as Goertzel function. A description of the Goertzel algorithm itself and the determination of any spectral component using the Goertzel algorithm can be found, for example, in the following publication: Petr Sysel and Pavel Rajmic: Goertzel algorithm generalized to non-integer multiples of fundamental frequency, EURASIP Journal on Advances in Signal Processing 2012. The contents of this document are incorporated in the present patent application in their entirety by making reference thereto.

According to a further embodiment, determining the specific spectral signal component is performed by applying the Fast Fourier Transform (FFT) to at least part of the plurality of measured values. The Fast Fourier Transform is an efficient implementation of a discrete Fourier transform that allows a spectral analysis of a signal defined by sampling points. From the spectral analysis, the specific spectral signal component can then be determined. The Fast Fourier Transform thus represents an alternative to the above-mentioned Goertzel algorithm for determining the specific spectral signal component from the sampling points or from a subset of the sampling points.

According to a further embodiment, the method further comprises the following step: selecting a subset of the plurality of measured values. In this case, the specific spectral signal component is determined in the subset of the plurality of measured values. In other words, only a subset of the sampling points of the momentary magnetic field is used for determining the specific spectral signal component. Selecting the subset of the plurality of measured values as sampling points allows the measured values to be limited to a subset of comparatively relevant measured values, which permits high accuracy in the subsequent determination of the specific spectral signal components and the subsequent determination of the position of the driven moving portion.

According to a further embodiment, the subset of the plurality of measured values is taken from magnetic field sensors arranged adjacent each other. In this manner, a coherent set of measured values is selected, from which the specific spectral signal component can be determined in a particularly reliable manner.

According to a further embodiment, the subset of the plurality of measured values comprises between 4 and 10 measured values, in particular between 5 and 8 measured values, still more in particular 6 measured values. The mentioned number of measured values allows for a particularly good compromise between high reliability and accuracy as well as easily controllable complexity for the determination of the specific spectral signal component.

According to a further embodiment, selecting the subset of the plurality of measured values comprises the following steps: organizing the plurality of measured values in accordance with the spatial arrangement of the magnetic field sensors along the movement path of the moving portion; determining the first measured value whose absolute value exceeds a predetermined threshold value; and selecting said first measured value and adjacent measured values as said subset of the plurality of measured values. In this way, it can be ensured that those measured values that are as relevant as possible are used for the determination of the specific spectral signal component, whereby a high degree of reliability is achieved by the selection of adjacent measured values. The selection also takes place in a particularly efficient manner, since only the first measured value is picked out by way of a concrete analysis of the measured values and the other measured values of said subset are selected via the association with the magnetic field sensors. In the step of determining the first measured value whose absolute value exceeds the predetermined threshold value, the direction in which said first measured value is searched can be suitably determined for the particular application.

According to a further embodiment, the position of the driven moving portion is calculated from the position of that magnetic field sensor that delivered the first measured value and from the offset of the driven moving portion indicated by the phase angle of the specific spectral component. In other words, the exact position of the moving portion is determined from the offset of the driven moving portion with respect to the said "that" magnetic field sensor which delivered the first measured value. The position of the magnetic field sensor that delivered the first measured value is an example of a known position to which the offset is added or from which the offset is subtracted.

According to an alternative embodiment, the subset of the plurality of measured values is selected as the set of a predetermined number of measured values of adjacent magnetic field sensors that has the largest summed absolute value. In this way, those measured values are selected which describe the region of the strongest magnetic field and thereby promise high reliability in the position determination.

According to a further embodiment, determining the plurality of measured values comprises the following steps: providing measured data by the plurality of magnetic field sensors; and generating the plurality of measured values by calibrating the measured data, with said calibrating comprising compensating for drive magnetic-field components which are generated during operation by drive elements of the electric motor, in particular current-carrying coils of the electric motor. In this way, from raw measured data which detects all magnetic field components and thus includes both the magnetic field generated by the permanent magnets and the magnetic field generated by the electromagnets as signal components, a plurality of measured values are created which in essence comprise only the signal component of the magnetic field generated by the permanent magnets. Compensating for drive magnetic-field components can thus also be considered as a removal of signal components generated by the electromagnets of the stator and thus not by the permanent magnets of the moving portion. In this manner, the specific spectral signal component can be determined in a particularly reliable manner. Compensating for drive magnetic-field components may be performed in an algorithmic manner, e.g. via corresponding filters, or via the use of look-up tables, with the possibility to use the momentary control of the drive elements of the electric motor, i.e. the control of the electromagnets of the electric motor, as input.

According to a further embodiment, said calibrating further comprises: compensating for offsets of the plurality of magnetic field sensors; and/or compensating for production inaccuracies, in particular compensating for measurement errors caused by inaccurately positioned magnetic field sensors. In this manner, inherently inaccurate measurements of the magnetic field sensors, whether by sensor-inherent offsets of the magnetic field sensors or by magnetic field sensors positioned inaccurately relative to a nominal position, can be compensated for. In this way, the specific spectral signal component, in turn, can be determined in a particularly reliable manner.

According to a further embodiment, the steps of determining the plurality of measured values, determining the specific spectral signal component and determining the position of the driven moving portion are performed repeatedly during movement of the moving portion. By repeatedly performing said steps in operation, the position of the driven moving portion can be determined for different times so that an updated position of the moving portion is available at preferably regular intervals. In a particular embodiment, said steps are performed at least once per millisecond. In other words, these steps are carried out at least a thousand times per second, so that an updated position of the moving portion is made available at least a thousand times per second. In a further embodiment, said steps are performed at least once every 100 milliseconds. As a result, even more up-to-date position data are available for the moving portion. When the steps of selecting a subset of the plurality of measured values and/or calibrating the measured data are implemented in an embodiment, these steps or one of these steps can likewise be carried out repeatedly. This applies also to all other steps or modifications of the method described herein.

Exemplary embodiments of the invention further comprise a method of moving a driven moving portion of an electric motor, the method comprising the steps of: determining the position of the driven moving portion in accordance with a method for contactless determination of the position of the driven moving portion, as described in any of the above embodiments; and moving the driven moving portion on the basis of the determined position of the driven moving portion. In this way, a controlled movement of the driven moving portion is rendered possible, with said moving of the driven moving portion being dependent on the determined position of the driven moving portion. Thus, there is provided a closed control loop, due to which the movements of the driven moving portion can be carried out with very high precision.

According to a further embodiment, the electric motor comprises a plurality of coils arranged along the movement path of the moving portion, wherein the step of moving the driven moving portion comprises a controlled supply of electric current to the plurality of coils. In this way, the coils of the electric motor form a plurality of electromagnets, via which the moving portion can be moved with high accuracy.

According to a further embodiment, the driven moving portion is a piston of a pipetting device, wherein pipetting liquid is aspirated or dispensed by movement of the piston. In an alternative embodiment, the driven moving portion is coupled to a piston of a pipetting device such that the movement of the driven moving portion effects movement of the piston. The coupling can be effected with relatively little complexity, such as e.g. via a piston rod between a moving portion of a linear motor and a piston of a pipetting device, or by comparatively complex couplings, such as a gear arrangement between a rotationally movable rotor and the piston of the pipetting device.

Exemplary embodiments of the invention further comprise an electric motor with contactless position determination, comprising: a driven moving portion having a plurality of permanent magnets which generate a moving-portion magnetic field having a plurality of periodically spaced apart maxima; a stator, with the driven moving portion being movably disposed with respect to the stator; a plurality of magnetic field sensors which are arranged along a movement path of the moving portion for measuring the magnetic field present along the movement path; and a position determination unit which receives measured data from the plurality of magnetic field sensors. The position determination unit is configured to: provide a plurality of measured values from the measured data, the plurality of measured values being sampling points for a momentary magnetic field that is generated by the plurality of permanent magnets and dependent on the position of the moving portion; determine a specific spectral signal component from the plurality of measured values, said specific spectral signal component having the spatial frequency corresponding to the distance between adjacent like maxima of the moving-portion magnetic field; and determine the position of the driven moving portion on the basis of the specific spectral signal component.

The additional features, modifications and technical effects described hereinbefore with respect to the method for contactless determination of the position of the driven moving portion of an electric motor are applicable analogously to the electric motor with contactless position determination. In particular, the position determination unit of the electric motor can be configured to carry out the modified and/or additional steps of the method described above.

The driven moving portion of the electric motor is movable with respect to the stator and with respect to the plurality of magnetic field sensors. In other words, the moving portion moves in a system referred to as static, which is defined by the stator and the plurality of magnetic field sensors. It is again emphasized that the electric motor may be a linear motor in which the moving portion moves linearly with respect to the plurality of magnetic field sensors. It is also possible that the electric motor has a rotationally movable rotor as moving portion, which rotates in the system formed by the stator and the plurality of magnetic field sensors.

According to a further embodiment of the invention, adjacent permanent magnets are of opposite polarity. The spacing of adjacent different maxima of the moving-portion magnetic field, i.e. the spatial distance between a magnetic south pole and a magnetic north pole of the moving-portion magnetic field generated by the permanent magnet arrangement, may correspond to the length of a permanent magnet or to the spacing between adjacent permanent magnets.

According to a further embodiment, the plurality of permanent magnets are arranged in series, with adjacent permanent magnets being oriented with like poles facing each other. In particular, the permanent magnets may be bar magnets. The permanent magnets may be arranged in series on the movement path of the moving portion. The distance between adjacent like maxima may be twice the length of a permanent magnet. With such an arrangement, a particularly good compromise of high magnetic field density and thus high force of the electric motor on the one hand and sharp definition of the maxima of the moving-portion magnetic field and thus very accurate position determination on the other hand can be achieved.

In a linear motor, the moving portion may have a plurality of permanent magnets, which each comprise a south pole and a north pole and which are arranged with like poles adjacent each other. In other words, adjacent permanent magnets may each be arranged such that their north or south poles are located adjacent each other. In an electric motor with a rotationally movable rotor, the permanent magnets may be arranged such that adjacent permanent magnets have a polarity alternating in the direction towards the air gap. The distance between the centers of adjacent permanent magnets then is the pole distance or pitch of the moving-portion magnetic field. In the event of the rotor, the pole distance can be specified as a geometric angular dimension. However, it is also possible to specify the pole distance as a geometric length dimension. The spatial frequency of the specific spectral signal component may be adjusted on the basis of the radial offset between the magnetic field sensors and the permanent magnets with respect to the spacing of the maxima of the moving-portion magnetic field along the permanent magnets. This is an example of the scenario described above, according to which the spatial frequency of the specific spectral signal component takes into account the geometry of the overall system, but still corresponds to the distance between like maxima the moving-portion magnetic field.

According to a further embodiment, the plurality of magnetic field sensors are a plurality of Hall sensors. In this manner, the magnetic field present at the magnetic field sensors can be measured very directly.

According to a further embodiment, the plurality of magnetic field sensors are arranged substantially uniformly along the movement path of the moving portion. A substantially uniform arrangement of the magnetic field sensors allows regular intervals between the sampling points, whereby a particularly accurate and reliable determination of the specific spectral signal component is rendered possible. A regular arrangement of the magnetic field sensors also allows a particularly good filtering out of the magnetic field component generated by the electromagnets. In a linear motor, the magnetic field sensors can be arranged along a straight line, which allows a very clear and plain construction. They can also be arranged differently, e.g. in a spiral path around the movement path of the moving portion. In an electric motor with a rotationally movable rotor, the magnetic field sensors can be arranged on a circular path.

According to a further embodiment, the driven moving portion has between 4 and 8 permanent magnets, in particular 5 or 6 permanent magnets. The specified number of permanent magnets is a good compromise between an efficient movement of the moving portion via the electromagnets of the stator and a good position determination. In particular, the specified number of permanent magnets allows for a good compromise between high accuracy and reliability and well-controlled complexity in determining the specific spectral signal component.

According to a further embodiment, the plurality of permanent magnets are adhered to each other. In this way, it is achieved by simple means that the pole pitch of the moving-portion magnetic field is defined by the dimensions of the permanent magnets, which can be well controlled in terms of production technology.

According to a further embodiment, the distance between adjacent like maxima of the moving-portion magnetic field is between 10 mm and 20 mm, in particular between 12 mm and 15 mm, still more in particular between 13 mm and 14 mm. The values indicated allow for a good compromise between moving portion dimensioning, achieving a sufficient magnetic field density for the movement of the moving portion and a well-processable resolution in determining the specific spectral signal component.

According to a further embodiment, the position determination unit is configured to determine the position of the driven moving portion by means of the phase angle of the specific spectral signal component. In this regard, the position determination unit can be configured to convert the phase angle of the specific spectral signal component into an offset of the driven moving portion with respect to a known position.

According to a further embodiment, the position determination unit is configured to determine the specific spectral signal component by applying the Goertzel algorithm to the sampling points. It is also possible to determine the specific spectral signal component by applying the Fast Fourier Transform (FFT) or another suitable kind of signal processing.

According to a further embodiment, the position determination unit is configured to select a subset of the plurality of measured values and to determine the specific spectral signal component in the subset of the plurality of measured values.

According to a further embodiment, the subset of the plurality of measured values comprises between 4 and 10 measured values, in particular between 5 and 8 measured values, still more in particular 6 measured values.

According to a further embodiment, the position determination unit comprises a microcontroller. With a microcontroller, the specific spectral signal component and the position of the driven moving portion can be determined very quickly and efficiently. The microcontroller can be optimized for these processing steps, so that the position of the driven moving portion can be provided almost in real time. However, it is also possible to use a universal microcontroller for determining the position of the moving portion from the measured data. In general, any kind of data processing device, e.g. also a computer with appropriate software, can be used. Exemplary suitable microcontrollers are the Renesas® RX71M and the Renesas® RX63T.

According to a further embodiment, the stator has a plurality of coils arranged along the movement path of the moving portion, with the driven moving portion being movable by controlled supply of electric current to the plurality of coils.

According to a further embodiment, the arrangement of the plurality of magnetic field sensors is matched to the arrangement of the plurality of coils. In a linear motor, the magnetic field sensors and the coils may be arranged at the same regular intervals along the movement path of the moving portion. In an electric motor with a rotor, the magnetic field sensors and the coils may be arranged at the same regular angular intervals as viewed from the center of the rotor. Such matching of the arrangement of magnetic field sensors and the arrangement of coils permits particularly reliable and accurate generation of the measured values from the raw measured data, because the magnetic fields of the coils are very regular from the point of view of the magnetic field sensors.

According to a further embodiment, the electric motor further comprises a control unit coupled to the position determination unit and configured to control the flow of current through the plurality of coils on the basis of the determined position of the driven moving portion. In this way, a closed control loop is provided in which the position of the moving portion is controlled via the plurality of coils on the basis of the position of the moving portion determined from measured data.

According to a further embodiment, the electric motor is a linear motor, wherein the driven moving portion is linearly movable on the movement path.

According to an alternative embodiment, the driven moving portion is a rotor that is rotationally movable relative to the stator, with the movement path of the moving portion being substantially circular. As stated above, the movement path of the moving portion can be defined as the sum of all the points that are passed through by a specific component of the rotor during one revolution. In particular, the movement path of the moving portion may be defined as the set of points that a point of an air gap facing surface of a permanent magnet passes during one revolution.

According to a further embodiment, the electric motor comprises a reference point sensor which detects a passing by of a predetermined portion of the rotor. In this way, the number of revolutions of the rotor can be measured. Together with the above-described position determination of the moving portion, i.e. of the rotor in the present case, a total rotation of the rotor can thus be determined.

Any of the above-described embodiments of the method for contactless determination of the position of a driven moving portion of an electric motor are applicable to the electric motor in all of the embodiments described above. The combination of all features of the embodiments of the method, individually or in any combination, with all features of the embodiments of the device of the electric motor, individually or in any combination, is herewith explicitly disclosed.

It is to be noted in general that the contactless determination of the position of the moving portion may relate to determining the absolute position of the moving portion or may relate to determining a relative position of the moving portion. In other words, the result of the position determination may be an absolute position or a relative position with respect to a coarse position of the moving portion determined in some other way.

Exemplary embodiments of the invention further comprise a pipetting system for aspirating and dispensing pipetting liquid, comprising: a piston having a liquid-facing end and a liquid-remote end; a pipetting channel in which the piston is disposed and at the end of which a pipetting tip is arranged, wherein, by moving the piston, aspirating and dispensing of pipetting liquid through the pipette tip is possible; and an electric motor according to any of the above-described exemplary embodiments, wherein the driven moving portion is the piston or part of the piston or wherein the driven moving portion is drivingly coupled to the piston. The additional features, modifications and technical effects described above with respect to the electric motor and with respect to the method for contactless determination of the position of the driven moving portion of the electric motor are analogously applicable to the pipetting system for aspirating and dispensing pipetting liquid.

In a pipetting system, the electric motor making use of contactless position determination, as pointed out in the above-described exemplary embodiments, can be used particularly advantageously. The position determination with the electric motor described takes place in particularly fast and accurate manner. Thus, the piston of the pipetting system can be controlled with high dynamics. This is particularly advantageous in pipetting systems because they are intended, for example when used in laboratory automation, to carry out a large number of pipetting operations in the shortest possible time and with the highest possible precision. Particularly advantageously, such an electric motor can be used in relatively new pipetting systems, which move the piston back and forth at very high speeds for a pipetting operation, wherein the stroke of the piston is many times higher than the volume of the aspirated or dispensed liquid and the aspiration or dispensing of the liquid takes place via a pressure wave established with high dynamics. In particular in such a system characterized by high dynamics, the fast and precise position determination of the moving portion of the electric motor is extremely valuable. Such a high-dynamics pipetting system is disclosed in WO 2017/0107084 A1. The contents of the aforementioned application are fully incorporated into the present patent application by making reference thereto. In particular, the pipetting system of the present patent application can be further implemented with all features of the claims of WO 2017/0107084 A1, individually or in any combination.

According to a further embodiment, at least the liquid-facing end of the piston has a seal with respect to the pipetting channel, whereby a sealed volume is present in the pipetting channel between the liquid-facing end of the piston and the pipetting tip. The liquid-remote end of the piston may also have a seal with respect to the pipetting channel. By providing two seals at both ends of the piston, it can be ensured that the piston has a substantially symmetrical behavior within the pipetting channel for the two directions of movement.

Exemplary embodiments of the invention further comprise a computer program or a computer program product which comprises program instructions which, when executed on a data processing system, perform a method according to any of the embodiments described above. In this regard, the individual steps of the method can be initiated by the program instructions and executed by other components or executed in the data processing system itself.

BRIEF DESCRIPTION OF THE DRAWINGS

Additional exemplary embodiments of the invention will be described below with reference to the figures.

DETAILED DESCRIPTION

Figure 1:
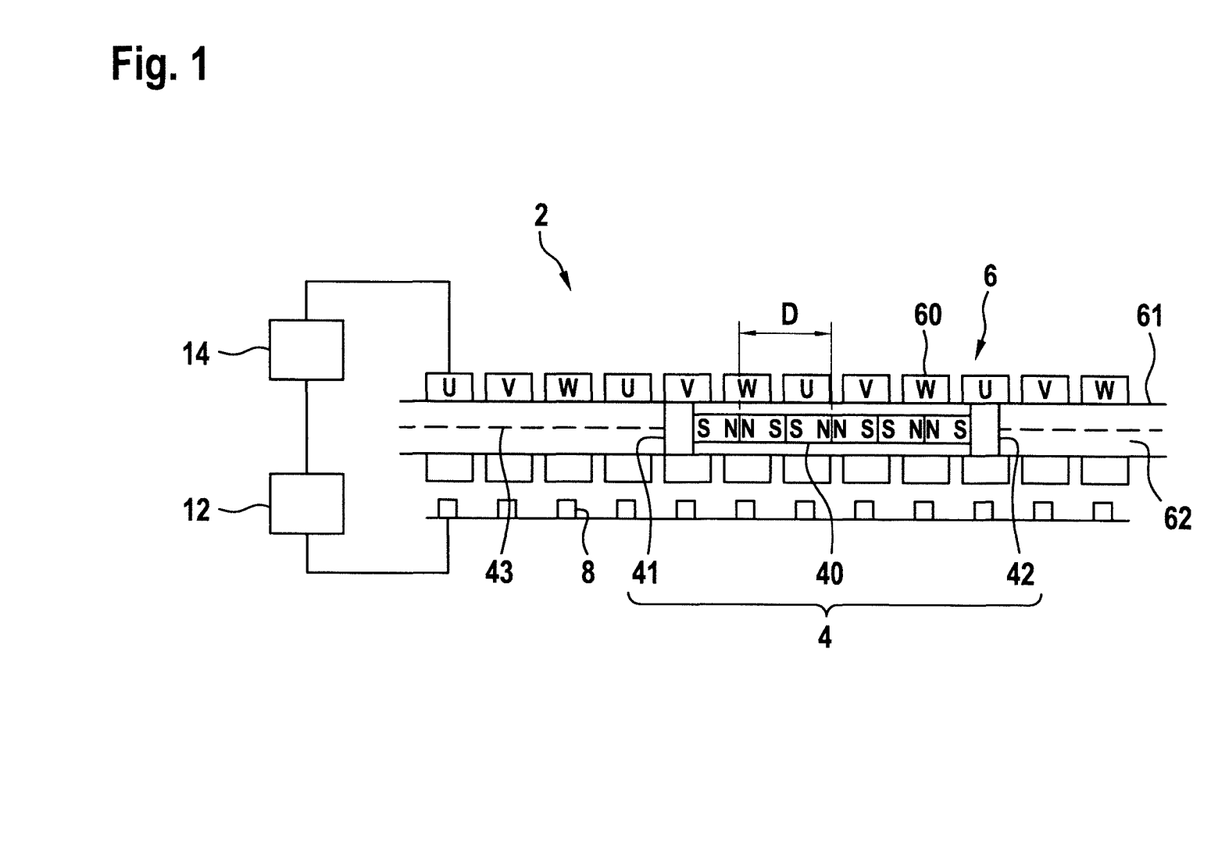
FIG. 1 shows an electric motor according to an exemplary embodiment of the invention, partly in a schematic longitudinal cross-sectional view and partly in a block diagram.

FIG. 1 shows an electric motor 2 according to an exemplary embodiment of the present invention. The electric motor 2 has a stator 6 and a rotor 4. In addition, the electric motor 2 has a plurality of magnetic field sensors 8, a position determination unit 12 and a control unit 14. The electric motor 2 is a linear motor in which the moving portion 4 moves on a linear movement path with respect to the stator 6 and with respect to the plurality of magnetic field sensors 8.

The stator 6 has a channel 62 which is formed by a hollow cylinder 61. Around the hollow cylinder 61, there are arranged a plurality of coils 60. In the present example, twelve coils 60 are arranged around the hollow cylinder 61. The coils 60 are driven to move the moving portion 4 by means of three-phase current. To illustrate the three-phase current, the coils 60 are alternately provided with the letters U, V and W. It is emphasized that the supply of three-phase current is merely exemplary and that any suitable type of current flow through the coils 60 can be used to apply a magnetic force to the moving portion 4. It is well known to those skilled in the art how coils of a stator can be energized in order to apply a magnetic force to a moving portion. Consequently, no further statements regarding the specific current flows through the coils 60 are necessary.

The moving portion 4 comprises a plurality of permanent magnets 40. In the present example, the moving portion 4 has six permanent magnets 40. The six permanent magnets 40 are bar magnets, each having a south pole at one end thereof and a north pole at the other end thereof. The six permanent magnets 40 are arranged with opposite polarity with respect to each other. In other words, the north pole of the first permanent magnet is disposed adjacent to the north pole of the second permanent magnet, the south pole of the second permanent magnet is disposed adjacent to the south pole of the third permanent magnet, the north pole of the third permanent magnet is disposed adjacent to the north pole of the fourth permanent magnet, etc. The respective adjacent ends of the permanent magnets 40 are adhered to each other so that the six permanent magnets 40 form a unit. The arrangement of the permanent magnets 40 results in an alternating moving-portion magnetic field. Between adjacent north poles and south poles of the arrangement of permanent magnets, there is a fixed pole distance, which corresponds to the length of a single permanent magnet. The distance between like maxima of the moving-portion magnetic field is denoted D and corresponds to twice the length of the permanent magnets.

The moving portion 4 is movable along a linear movement path 43 which extends through the channel 62 of the stator 6. The moving portion 4 has a first end cap 41 and a second end cap 42. By means of the end caps 41 and 42, the moving portion 4 is supported in the channel 62 such that it can move along the movement path 43, but is substantially not movable in directions orthogonal to the movement path 43.

In the exemplary embodiment of FIG. 1, the electric motor 2 has twelve magnetic field sensors 8. The magnetic field sensors 8 are Hall sensors. Exemplary suitable Hall sensors are the Allegro® A1308LLHLX-1-T and the EQ-433L from Asahi Kasei Microdevices®. However, other types of magnetic field sensors may be used as well. The magnetic field sensors 8 are arranged along the movement path 43 of the moving portion 4. In particular, the magnetic field sensors 8 are arranged on a straight line which is parallel to the movement path 43. The magnetic field sensors 8 are arranged outside of the coils 60 of the stator 6. The arrangement of the magnetic field sensors 8 is matched to the arrangement of the coils 60. The number of magnetic field sensors 8 corresponds to the number of coils 60. Both the magnetic field sensors 8 and the coils 60 are arranged at regular intervals along the movement path 43 of the moving portion 40. One coil and one magnetic field sensor each are arranged at the same axial position with respect to the movement path 43.

The plurality of magnetic field sensors 8 are connected to the position determination unit 12, wherein for reasons of clarity only the connection between one magnetic field sensor and the position determination unit 12 is illustrated. The position determination unit 12 receives measured data from the magnetic field sensors 8. From these measured data, the position determination unit 12 determines the position of the moving portion 4, as described in detail below.

The position determination unit 12 is coupled to the control unit 14 and in operation transmits the position of the moving portion 4 to the control unit 14. The control unit 14 compares the position of the moving portion 4 determined by the position determination unit 12 with a desired position of the moving portion 4 and controls the coils 60 of the stator 6 in such a way that the moving portion 4 is moved to the desired position within the channel 62. For this purpose, the control unit 14 is connected to the coils 60 wherein, again for reasons of clarity, only one connection between the control unit 14 and one of the coils 60 is illustrated.

The operation of the electric motor 2, in particular the determination of the position of the moving portion 4 within the stator 6 by the position determination unit 12, will be described in detail below with reference to FIGS. 3 and 4.

The position determination unit 12 and the control unit 14 may be implemented as separate units, as described above. However, it is also possible that the position determination unit 12 and the control unit 14 are formed as one integrated unit. Each of the position determination unit 12 and control unit 14 may comprise hardware or software or a combination of hardware and software. In particular, both the position determination unit 12 and the control unit 14 as well as an integrated unit may comprise a processor and a memory. There may be provided a computer program that executes or initiates the method steps for operating the electric motor 2, including the determination of the position of the moving portion 4.

Figure 2:
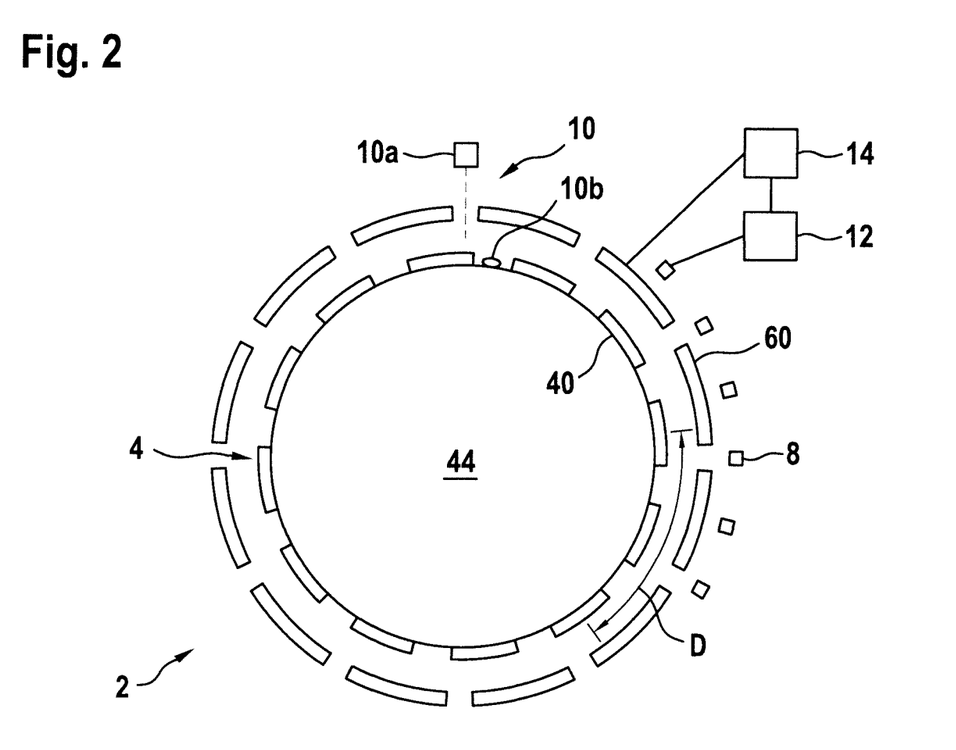
FIG. 2 shows an electric motor according to a further exemplary embodiment of the invention, partly in a schematic transverse cross-sectional view and partly in a block diagram.

FIG. 2 shows an electric motor 2 according to a further exemplary embodiment of the present invention. Again, the electric motor 2 comprises a moving portion 4 having a plurality of permanent magnets 40, a stator 6 having a plurality of coils 60, a plurality of magnetic field sensors 8, a position determination unit 12, and a control unit 14.

The moving portion 4 is a rotationally movable rotor in the present case. The rotor 4 has a rotor body 44, on the outside of which the permanent magnets 40 are mounted. The rotor 4 has twelve permanent magnets which are distributed around the circumference of the rotor body 44. The permanent magnets 40 have an alternating polarity. That is, of the permanent magnets 40 arranged adjacent each other, one of them is arranged with its south pole facing outwardly, while the other one is arranged with its north pole facing outwardly. The pole distance or pitch of the moving-portion magnetic field is defined as the distance between the centers of adjacent permanent magnets. The pole distance can be specified either as a geometric angular value or as a geometric length interval for a specific radial position. Like maxima of the moving-portion magnetic field have the distance D, i.e. twice the pole distance.

The coils 60 of the stator 6 are arranged around the rotor body 44 and around the permanent magnets 40, such that an air gap results between the permanent magnets 40 and the coils 60, through which a magnetic force is applied from the coils 60 to the permanent magnets 40 for moving the moving portion 4. The plurality of magnetic field sensors 8 are arranged around the coils 60 along part of the circumference of the rotor body 44. They are thus arranged along the path of movement of the rotor 4, which in the present example is defined as the circle described by the surfaces of the permanent magnets 40 during rotation of the rotor 4. The electric motor 2 of FIG. 2 has six magnetic field sensors 8.

The coils 60 and the magnetic field sensors 8 are arranged in a stator housing, which is not shown in FIG. 2 for reasons of clarity. Since the skilled person is familiar with many possibilities for accommodating these components in a stator housing and rotatably supporting the rotor 4 with respect to such a stator housing, further explanations in this context are unnecessary.

Furthermore, the electric motor 2 comprises a reference point sensor 10, which in the present example consists of a first element 10*a* arranged in the stator 6 and a second element 10*b* arranged on the rotor body 44. In the present example, the second element 10*b* is a color surface, while the first element 10*a* is an optical sensor capable of detecting the color surface 10*b*. Furthermore, the first element 10*a* is provided with a counter which records the passes of the color surface 10*b* during operation. In this way, the revolutions of the rotor 4 can be measured.

In addition to this determination of the number of revolutions of the rotor 4, the determination of the exact rotational position of the rotor 4 is performed by the position determination unit 12 by means of the measured values of the magnetic field sensors 8. The position is then transferred to the control unit 14, during operation, which uses this information to energize the coils 60 accordingly in order to rotate the rotor 4 into a desired position. Again, only one of the connections between magnetic field sensors 8 and position determination unit 12 and one of the connections between control unit 14 and coils 60 are illustrated in FIG. 2 for the sake of clarity. However, all of the magnetic field sensors 8 are connected to the position determination unit 12 and all of the coils 60 are connected to the control unit 14.

The position determination by means of the position determination unit 12 will also be described in the following for the electric motor 2 of FIG. 2 with reference to FIGS. 3 and 4.

It is emphasized that FIG. 1 and FIG. 2 show only exemplary arrangements of stator, moving portion and magnetic field sensors. Many other arrangements are possible. For example, it is possible that, in addition to the permanent magnets illustrated, which are provided for driving the moving portion, further permanent magnets are present which generate the moving-portion magnetic field used for determining the position. These additional permanent magnets can be arranged at a different spacing than the permanent magnets provided for driving, in order to reliably determine the specific spectral signal component. For example, in the case of an electric motor with a rotationally movable rotor, it is possible for such additional permanent magnets to be arranged around the entire circumference of the rotor, with the magnetic field sensors being arranged only along a part of the movement path of the rotor. However, it is also possible that the additional permanent magnets are arranged only around part of the circumference of the rotor, with the magnetic field sensors being arranged along the entire movement path of the rotor.

Figure 3:
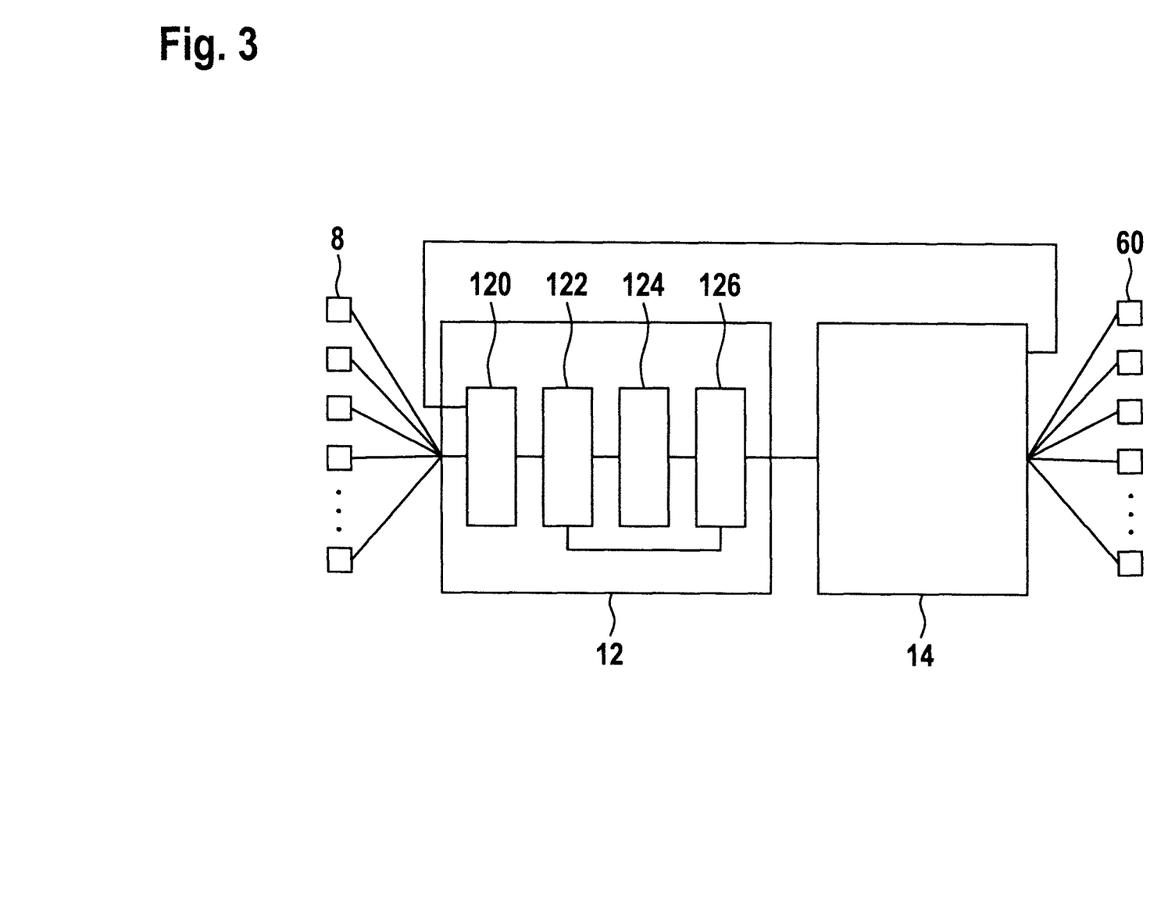
FIG. 3 shows a block diagram of the signal processing chain in an electric motor according to an exemplary embodiment of the invention.

FIG. 3 shows a block diagram of the signal processing chain in an electric motor according to an exemplary embodiment of the invention. The signal processing chain illustrated also serves for providing a detailed description of a method for the contactless determination of the position of a moving portion of an electric motor according to an exemplary embodiment of the invention. The signal processing chain illustrated can be used both in the electric motor according to FIG. 1 and in the electric motor according to FIG. 2.

FIG. 3 shows the connection of the plurality of magnetic field sensors 8 to the position determination unit 12, the connection of the position determination unit 12 to the control unit 14 and the connection of the control unit 14 to the plurality of coils 60. In the following, the position determination unit 12 will be dealt with in particular while describing the individual steps of determining the position of the moving portion from the measured data of the magnetic field sensors 8. In this regard, reference will also be made to FIG. 4 for illustration.

The position determination unit 12 comprises a calibration module 120, a selection module 122, a Goertzel algorithm module 124 and a position calculation module 126. The calibration module 120 is connected to the magnetic field sensors 8 and receives the measured data from the magnetic field sensors 8. The calibration module 120 is connected furthermore to the selection module 122. The selection module 122 in turn is connected to the Goertzel algorithm module 124 and to the position calculation module 126. The Goertzel algorithm module 124 is also connected to the position calculation module 126. The position calculation module 126 is connected to the control unit 14. In addition, the control unit 14 is connected to the calibration module 120.

The calibration module 120 receives raw measured data from the magnetic field sensors 8, i.e. the calibration module 120 receives measured data describing the superimposition of all magnetic fields present at the locations of the magnetic field sensors 8. The magnetic field sensors may each have analog-to-digital converters of their own. It is also possible that the outputs of the magnetic field sensors are connected in rapid succession to the same analog-to-digital converter, which then passes the measured data as a measurement series in digital form to the calibration model. An exemplary suitable analog-to-digital converter is the AD7266BCPZ from Analog Devices®. The calibration module 120 filters the raw measured data and generates measured values describing the magnetic field generated by the permanent magnets of the moving portion at the locations of the magnetic field sensors 8. For this purpose, the calibration module 120 filters out those signal components from the measured data that do not have their origin in the permanent magnets. In the present example, the calibration module 120 filters out three types of signal components.

First, the measured data are corrected by offset values of the magnetic field sensors 8. To determine the offset values, the measured values of the magnetic field sensors are measured before normal operation of the electric motor without moving portion in the stator and without current flow in the coils. These measurements represent offset values and are stored for the individual magnetic field sensors 8. In the calibration module 120, these offset values are added or subtracted during normal operation.

Second, the signal components of the magnetic field generated by the coils of the stator are filtered out. For this purpose, known voltages are applied to the coils in a test operation, and the resulting magnetic fields are measured, with the measured data of the test being stored. In normal operation, the control unit 14 sends a signal to the calibration module 120 with which the control unit 14 informs about the voltages applied to the coils 60. The calibration module accesses the measured test data and eliminates the corresponding components in the measured data.

Third, inaccurate placings of the magnetic field sensors 8 are compensated for. Each of the magnetic field sensors 8 has a nominal position at which it is to be placed according to the design of the electric motor. However, there may be inaccuracies occurring in production that cause the actual position of one or more of the magnetic field sensors to deviate from the nominal position. Thus, the magnetic field sensor(s) does/do not measure the magnetic field at the nominal position but at the actual position. By means of measurements in a test mode, corresponding correction factors or algorithms are created by means of which the measured data are converted into the magnetic field estimated for the nominal position.

As an output, the calibration module provides a set of measured values for the momentary magnetic field generated by the plurality of permanent magnets and present in the reference system of the stator. It is emphasized that the calibration may be imperfect and the measured values for the momentary magnetic field generated by the plurality of permanent magnets are estimates. This can even be the normal case. The measured values for the momentary magnetic field generated by the plurality of permanent magnets therefore can also be described as estimated values based on an actual measurement.

The measured values are transmitted to the selection module 122. In FIG. 4, the measured values are represented by circles and generally provided with reference numeral 70. Although the number of measured values and thus the number of magnetic field sensors does not coincide with the electric motor of FIG. 1, it is nevertheless clearly conceivable that the measured values shown from left to right in FIG. 4 may belong to an arrangement of magnetic field sensors along a linear motor, as shown in FIG. 1. The x-axis of FIG. 4 illustrates the unit cm, with the x-values indicating the distance with respect to a reference point of the electric motor, e.g. with respect to an end of a channel of a linear motor. For the position determination of the electric motor of FIG. 2, the selection module may also be omitted. Since the electric motor of FIG. 2 has only six magnetic field sensors and since part of the moving-portion magnetic field is applied at all times to all magnetic field sensors due to the arrangement of the permanent magnets around the entire circumference of the rotor body, a reduction of the measured values may be undesirable.

The selection module 122 receives the set of measured values 70 from the calibration module 120 and selects a subset of relevant measured values. At this time, the selection module 122 calculates, for each measured value, an absolute value of the magnetic field generated by the plurality of permanent magnets. The absolute value is defined as the absolute deviation from a sensor reference value, which represents the measured value of a magnetic field sensor at a great distance from the permanent magnets. In the diagram of FIG. 4, the sensor reference value is defined as value 0.

The selection module 122 sequentially checks for the resulting absolute values, starting with the absolute value associated with the magnetic field sensor at the position 0 cm, which absolute value is above a predetermined threshold value. In the exemplary embodiment of FIG. 4, the predetermined threshold value is at 800, the values being regarded as dimensionless output values and having purely exemplary values. For the measured values illustrated in FIG. 4, the selection module 122 determines that the absolute value of the measurement associated with the 3.7 cm position magnetic field sensor is the first absolute value that is above the predetermined threshold value. On the basis of this determination, the selection module 122 selects the measured value associated with the 3.7 cm position magnetic field sensor and the adjacent five measured values as the relevant subset. The selected measured values are provided with a cross in FIG. 4 for illustration and designated with reference numeral 72.

The six selected measured values 72 are transmitted to the Goertzel algorithm module 124. In addition, the selection module 122 transmits the position of that magnetic field sensor to the position calculation module 126 whose measured value had the first absolute value above the predetermined threshold value. In the present example, the selection module 122 transmits the position 3.7 cm to the position calculation module 126. Through this transmission, the position calculation module 126 is informed that a predetermined component of the moving portion, as described below, is near the position 3.7 cm. The position 3.7 cm is referred to as known position. The exact position of the moving portion can then be calculated by linking this known position and the result of the Goertzel algorithm module 124.

The Goertzel algorithm module 124 receives the six selected measured values 72 as basis for the Goertzel algorithm. In other words, the six selected measured values 72 are the sampling points by means of which the Goertzel algorithm is executed. The Goertzel algorithm determines that spectral signal component from the sampling points whose spatial frequency corresponds to the distance D between two adjacent like maxima of the moving-portion magnetic field. In the present example, the Goertzel algorithm thus determines the spectral content of the signal formed by the sampling points for the spatial frequency which corresponds to twice the pole distance of the permanent magnets of the moving portion. Said spectral signal component or said spectral content for said specific spatial frequency is also referred to as specific spectral signal component. The distance D between two adjacent like maxima is 1.38 cm in the illustrated example.

The analysis of the sampling points with respect to the specific spectral signal component is based on the consideration that the permanent magnets having the defined pole pitch generate a magnetic field that has a strong oscillating component at the spatial frequency which is twice the pole pitch. In other words, the analysis described is based on the consideration that a plurality of permanent magnets with a defined pole pitch also produce, to a substantial part, a magnetic field changing with this defined pole pitch. The position of this magnetic field is determined by the spectral analysis with respect to the specific spectral signal component.

Figure 4:
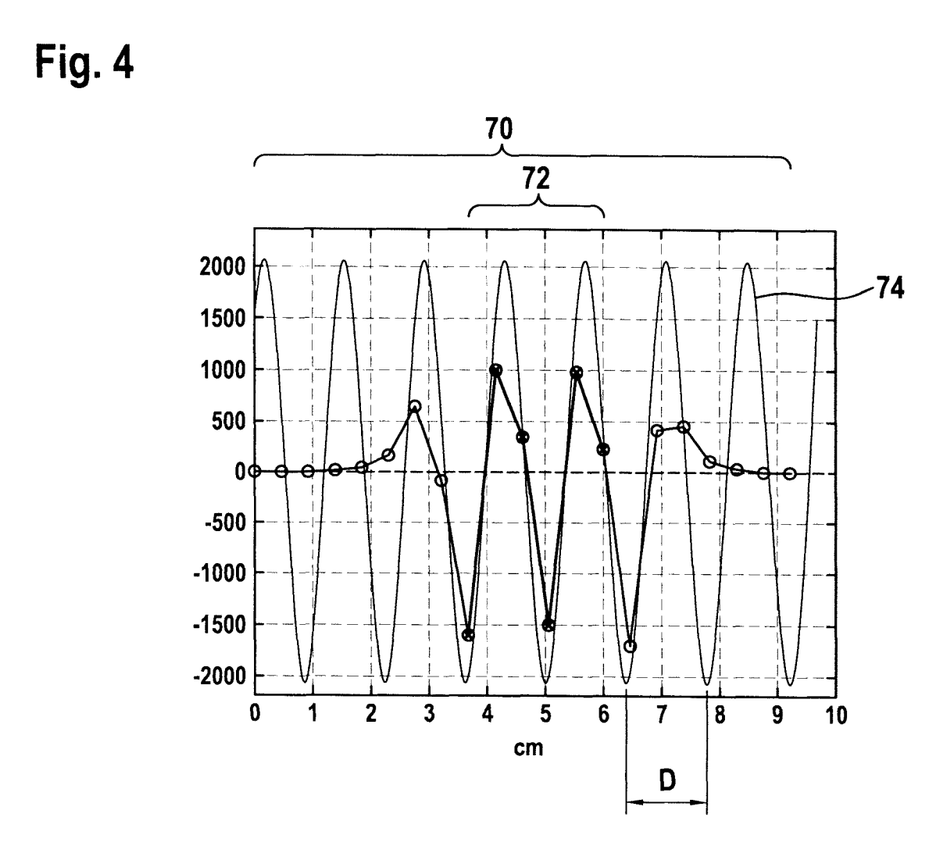
FIG. 4 shows exemplary measured values of the magnetic field sensors and illustrates an example of a determination of the specific spectral signal component.

The specific spectral signal component is provided with reference numeral 74 in FIG. 4 and illustrated as a sinusoidal curve over the entire length. The specific spectral signal component 74 can be described as a continuous curve, as shown in FIG. 4. However, it can also be described by two characteristic values, namely by the amplitude and the phase angle. In this case, the amplitude describes the strength of the magnetic field component generated by the permanent magnets and oscillating with the specific spatial frequency. The phase angle describes an offset of the oscillating magnetic field component with respect to a known position, e.g. with respect to the position of the first magnetic field sensor whose measured value has an absolute value above the predetermined threshold value, or with respect to the position of an end or other reference value of the electric motor. The offset is defined in the present example of FIG. 4 as the distance between the position of that magnetic field sensor whose measured value had the first absolute value above the predetermined threshold value, i.e. 3.7 cm in the present example, and the position of the next local maximum or minimum of the specific spectral signal component 74. In the present example, the offset is −0.1 cm.

The Goertzel algorithm module 124 transmits the offset to the position calculation module 126, which calculates the position of the driven moving portion from the offset and the known position received from the selection module 122. In the present example, the position of the driven moving portion results as 3.6 cm, which corresponds to the sum of 3.7 cm and −0.1 cm. Thus, the position calculation module 126 has determined the position of the moving portion and transmits this information to the control unit 14.

Which component or which part of the moving portion is to be found at the determined position of the moving portion is due to the specific design of the electric motor and the particular implementation of the signal processing described above. In the example of FIGS. 3 and 4, the position of the moving portion determined by the above signal processing is the position of the second pole along the movement path of the moving portion. The background for the identification of the position of the second pole is the consideration that the second pole is more clearly identifiable than the first one, because the magnetic field generated by the first pole extends further due to the absence of additional poles and is therefore weaker. In the measured values of FIG. 4, this can be seen from the fact that, before the measured value of the magnetic field sensor at the position 3.7 cm, there is already a peak in the other direction, which is less strong. The predetermined threshold value is selected such that the absolute value of the magnetic field of the second pole exceeds the predetermined threshold value. On the basis of the known geometry of the moving portion, it is then possible to determine the position of any part of the moving portion. It is emphasized that, in addition to the determination of the position of the second pole described here, there are other possibilities for determining the position of a specific component of the moving portion. The component whose position is accurately and reliably determined can be selected and decided by the person skilled in the art for a given system in accordance with the individual circumstances.

The position determination unit 12 is described with reference to FIG. 3 as a combination of a plurality of modules. The modules are logical units that each perform a specific step of the signal processing operation. It can be seen that the separation of the individual steps in the actual implementation may be less sharp or that the processing steps or their sub-steps may be grouped differently. The position determination unit may be a microcontroller or any other suitable device for signal processing.

Thus, in the exemplary embodiment of FIG. 4, the position determination unit 12 requires between 30 µs and 40 µs for determining the position of the moving portion from the measured data of the magnetic field sensors. This means that the position of the moving portion is made available to the control unit 14 very quickly, in particular almost in real time. The high dynamics of the position determination unit 12 assist in effectively controlling the position of the moving portion, even if the same moves quickly.

Figure 5:
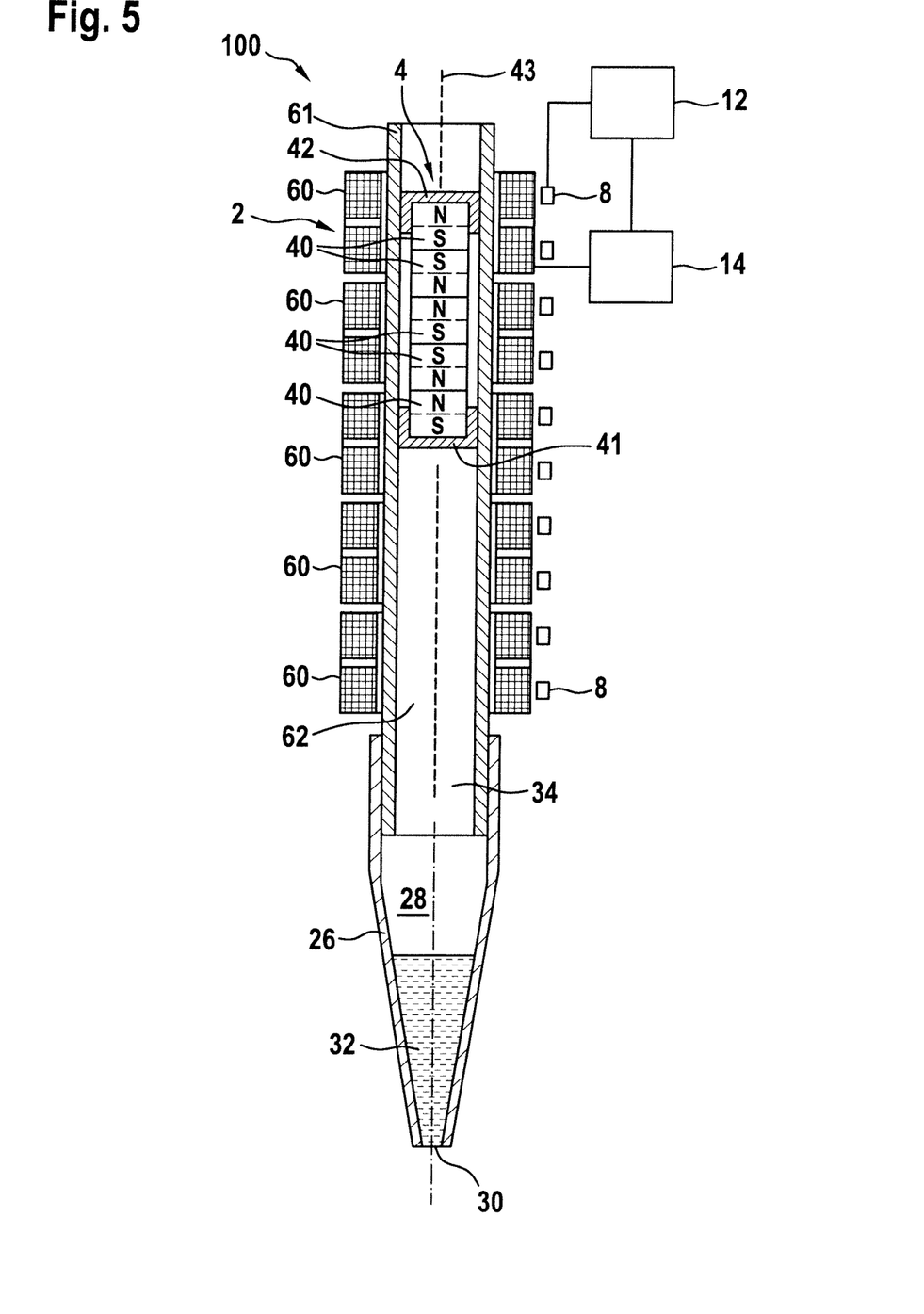
FIG. 5 shows a pipetting system according to an exemplary embodiment of the invention, partly in a schematic longitudinal cross-sectional view and partly in a block diagram.

FIG. 5 shows a pipetting system 100 according to an exemplary embodiment of the invention. The pipetting system 100 comprises an electric motor 2 which, in principle, is very similar to the electric motor 2 of FIG. 1. Analog components are provided with the same reference numerals and will not be described again. Express reference is made to the description of FIG. 1. The electric motor 2 is arranged vertically in the pipetting system 100 of FIG. 5.

The channel 62 formed by the hollow cylinder 61 is a pipetting channel 62 of the pipetting system 100. The moving portion 4 of the electric motor 2 is the piston 4 of the pipetting system 100, which is movably received in the pipetting channel 62. The first end cap 41 of the moving portion is the lower end cap of the piston, the second end cap 42 of the moving portion is the upper end cap of the piston. The first and second end caps 41, 42 are seals that seal the piston with respect to the pipetting channel 62.

The moving portion 4, in the present example, comprises five permanent magnets 40, which are arranged as in FIG. 1 in pairs with like poles facing each other. In the present example, ten Hall sensors 8 and ten coils 60 are further present. It can be seen that the number of permanent magnets, the number of coils and the number of magnetic field sensors can be adapted to the concrete embodiment.

The end caps 41, 42 are preferably formed from low-friction material comprising graphite, as it is known for example from commercially available pistons from Airpot Corporation of Norwalk, Conn., (US). In order to exploit the low friction provided by this material to the fullest possible extent, the hollow cylinder 61 is preferably designed as a glass cylinder, so that during movement of the piston 4 along the movement path 43, the graphite-comprising material slides with very low friction on a glass surface.

As described above with respect to FIGS. 1 to 4, the magnetic field sensors 8 transmit measured data to the position determination unit 12, which in turn determines the position of the piston 4 and transmits the same to the control unit 14, which in turn controls the coils 60 on the basis of the position of the piston 4. As regards the details of this control, reference is made to the above description.

At the dosing-side end of the pipetting channel, a pipetting tip 26 is releasably attached in a manner known per se. The pipetting tip 26 defines a pipetting space 28 in its interior, which at the end remote from the pipetting channel is accessible only via a pipetting opening 30. In the exemplary state prior to a dispensing process, as shown in FIG. 5, an amount of dosing liquid 32 is present in the pipetting space 28. This amount has been taken up by an aspiration process performed previously.

Between the moving portion 4 and the dosing liquid 32, a working gas 34 is permanently present, which serves as a force transmitter between the moving portion 4 and the dosing liquid 32. The working gas 34 is present between the moving portion 4 and a dosing liquid 32, even when the pipetting tip 26 is completely empty, since the pipetting tip 26 is immersed into a corresponding dosing liquid supply for aspirating dosing liquid, so that in this state there is a meniscus of the dosing liquid present at least at the pipetting opening 30. Thus, in each state relevant for a pipetting process, working gas 34 is permanently and completely present between the moving portion 4 and a dosing liquid 32 and separates the same from each other.

On the basis of the state illustrated in FIG. 5, two kinds of dispensing processes of the pipetting system 100 will be described in the following. On the one hand, it is possible to move the moving portion 4 comparatively slowly and to push out a corresponding amount of pipetting liquid 32 through the pipetting opening 30 by a comparatively slight increase in the pressure of the working gas 34. On the other hand, it is possible to move the moving portion 4 in a comparatively fast, whip-like movement and to push out the desired amount of pipetting liquid 32 through the pipetting opening 30 with the resulting pressure wave. In this embodiment, to dispense a very small amount of liquid, such as about 1 µl of the dosing liquid 32, a movement of the moving portion 4 can be caused with such a large stroke that the end surface of the first end cap 41 passes over a volume which is a multiple, for example, about 20 times the volume of the very small amount of liquid. As a result, a pressure wave is built up. In a very rapid succession, the moving portion 4 is retracted after the movement towards the pipetting liquid 32, with the moving portion 4 coming to a stop at a location where the change of its position relative to the initial position corresponds to the volume of the very small amount of liquid. By the return movement of the moving portion 4, a pressure drop counteracting the pressure wave is generated. The pressure wave pushes the very small amount of liquid out of the pipetting opening 30 before it fades away.

For both of the dispensing processes described, the moving portion can be moved in a controlled manner as described above with reference to FIGS. 1 to 4. Especially in the second embodiment with the comparatively fast movement of the moving portion 4, the above-described method for position determination is very well usable since the position of the moving portion 4 can be determined very quickly and the control of the position of the moving portion 4 can correspond to the high dynamics of the movement of the moving portion 4. The same applies analogously for aspiration processes.

Figure 6:
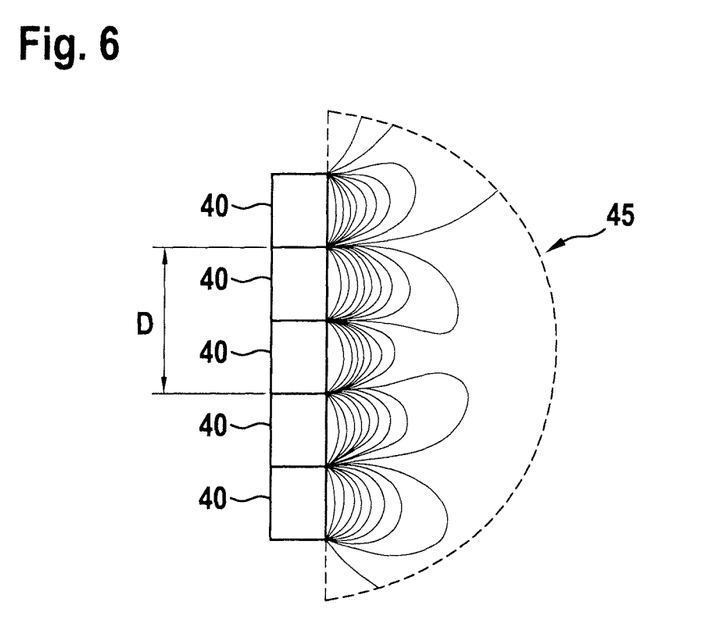
FIG. 6 shows a moving-portion magnetic field of an exemplary moving portion, as it may for example be used in the pipetting system of FIG. 5.

FIG. 6 shows a plurality of permanent magnets 40, as they may be provided e.g. in the moving portion 4 of the pipetting system 100 of FIG. 5, as well as a part of the moving-portion magnetic field 45. In particular, FIG. 6 shows five permanent magnets 40 which are respectively arranged with poles of opposite polarity facing each other, as described in detail hereinbefore with respect to FIG. 1 and FIG. 5. The distance D between adjacent like maxima of the moving-portion magnetic field thus corresponds to the length of two permanent magnets 40.

From the moving-portion magnetic field 45, a portion bounded by a broken line is shown in FIG. 6. The moving-portion magnetic field 45 is illustrated by a plurality of magnetic field lines. FIG. 6 reveals that in each case several magnetic field lines converge at the boundaries between the permanent magnets, which indicates a respective magnetic field maximum. At the boundaries between the permanent magnets, there is formed a magnetic field with a strong field component that is orthogonal to the orientation of the permanent magnets, and thus is radial in a rotationally symmetrical system. Such a strong magnetic field component can be detected well.

It is emphasized that neither FIG. 6 nor the previous figures are true to scale. They serve to illustrate the functional principle of exemplary embodiments of the invention. It can be seen, for example, that the strength of the moving-portion magnetic field and the distance between the permanent magnets and the magnetic field sensors can be matched to each other for a particularly efficient and reliable position determination.

The pipetting system of FIG. 5 may comprise any components and modifications shown in WO 2017/017084 A1. The contents of said patent application are incorporated into the present patent application in their entirety by making reference thereto.

The position determination method described and the electric motor described are also suitable for a pipetting system in which the piston directly abuts the pipetting liquid.

Furthermore, the position determination method described and the electric motor described are suitable for any other technical systems in which a component driven by an electric motor is moved with high accuracy.

Although the invention has been described with reference to exemplary embodiments, it will be apparent to those skilled in the art that various changes may be made and equivalents may be employed without departing from the scope of the invention. The invention should not be limited by the specific embodiments described. Rather, it encompasses all embodiments that fall under the appended claims.

The invention claimed is:

1. A method for contactless determination of the position of a driven moving portion of an electric motor by means of a plurality of magnetic field sensors, wherein the moving portion is movably arranged with respect to a stator and has a plurality of permanent magnets which generate a moving-portion magnetic field having a plurality of periodically spaced apart maxima, and wherein the plurality of magnetic field sensors are arranged along a movement path of the moving portion, the method comprising:
   determining, by means of the plurality of magnetic field sensors, a plurality of measured values for a momentary magnetic field that is generated by the plurality of permanent magnets and dependent on the position of the moving portion;
   selecting a subset of the plurality of measured values, wherein the subset of the plurality of measured values is taken from magnetic field sensors arranged adjacent each other;
   determining a specific spectral signal component from the subset of the plurality of measured values, the specific spectral signal component having a spatial frequency corresponding to the distance between adjacent like maxima of the moving-portion magnetic field; and
   determining the position of the driven moving portion by means of the specific spectral signal component, wherein said determining the position of the driven moving portion is performed by means of a phase angle of the specific spectral signal component, and wherein said determining the position of the driven moving portion comprises converting the phase angle of the specific spectral signal component into an offset of the driven moving portion with respect to a known position.

2. The method according to claim 1, wherein said determining the specific spectral signal component is performed by applying a Goertzel algorithm to at least part of the plurality of measured values.

3. The method according to claim 1, wherein said determining of the specific spectral signal component is performed by applying a Fast Fourier Transform (FFT) to at least part of the plurality of measured values.

4. The method according to claim 1, wherein said selecting the subset of the plurality of measured values comprises:
   organizing the plurality of measured values in accordance with the spatial arrangement of the magnetic field sensors along the movement path of the moving portion;
   determining a first measured value whose absolute value exceeds a predetermined threshold value; and selecting said first measured value and adjacent measured values as said subset of the plurality of measured values.

5. The method according to claim 1,
wherein said determining the plurality of measured values comprises:
providing measured data by the plurality of magnetic field sensors; and
generating the plurality of measured values by calibrating the measured data, wherein said calibrating comprises compensating for drive magnetic-field components, which are generated during operation by drive elements of the electric motor, in particular current-carrying coils, of the electric motor.

6. The method according to claim 5,
wherein said calibrating further comprises:
compensating for offsets of the plurality of magnetic field sensors, and/or
compensating for production inaccuracies, in particular compensating for measurement errors, caused by inaccurately positioned magnetic field sensors.

7. The method according to claim 1, further comprising:
moving the driven moving portion on the basis of the determined position of the driven moving portion.

8. The method of claim 7,
wherein the driven moving portion is a piston of a pipetting device or wherein the driven moving portion is coupled to a piston of a pipetting device for moving the piston, and wherein pipetting liquid is aspirated or dispensed by movement of the piston.

9. A computer program comprising program instructions which, when executed on a data processing system, perform a method according to claim 1.

10. An electric motor with contactless position determination, comprising:
a driven moving portion having a plurality of permanent magnets which generate a moving-portion magnetic field having a plurality of periodically spaced apart maxima;
a stator, with said driven moving portion being arranged so as to be movable with respect to the stator;
a plurality of magnetic field sensors which are arranged along a movement path of the moving portion for measuring the magnetic field present along the movement path; and
a position determination unit which receives measured data from the plurality of magnetic field sensors and is configured to:
provide a plurality of measured values from the measured data, the plurality of measured values being sampling points for a momentary magnetic field that is generated by the plurality of permanent magnets and dependent on the position of the moving portion,
select a subset of the plurality of measured values, wherein the subset of the plurality of measured values is taken from magnetic field sensors arranged adjacent each other,
determine a specific spectral signal component from the subset of the plurality of measured values, said specific spectral signal component having the spatial frequency corresponding to the distance between adjacent like maxima of the moving-portion magnetic field, and
determine the position of the driven moving portion on the basis of the specific spectral signal component by means of the phase angle of the specific spectral signal component, wherein the position determination unit is configured to convert the phase angle of the specific spectral signal component into an offset of the driven moving portion with respect to a known position.

11. The electric motor according to claim 10,
wherein the plurality of magnetic field sensors is arranged substantially uniformly along the movement path of the moving portion.

12. The electric motor according to claim 10,
wherein the plurality of permanent magnets is arranged in series and wherein adjacent permanent magnets are oriented with like poles facing each other.

13. The electric motor according to claim 10,
wherein the driven moving portion has between 4 and 8 permanent magnets.

14. The electric motor according to claim 10,
wherein the distance between adjacent like maxima of the moving-portion magnetic field is between 10 mm and 20 mm.

15. The electric motor according to claim 10,
wherein the position determination unit is configured to determine the specific spectral signal component by applying a Goertzel algorithm to the sampling points.

16. The electric motor according to claim 10,
wherein the stator comprises a plurality of coils disposed along the movement path of the moving portion, with the driven moving portion being movable by controlled supply of current to the plurality of coils, and
wherein the electric motor further comprises a control unit coupled to the position determination unit and configured to adjust the current flow through the plurality of coils on the basis of the determined position of the driven moving portion.

17. The electric motor according to claim 10,
wherein the electric motor is a linear motor and wherein the driven moving portion is linearly movable on the movement path.

18. A pipetting system for aspirating and dispensing pipetting liquid, comprising:
a piston having a liquid-facing end and a liquid-remote end;
a pipetting channel in which the piston is disposed and at the end of which a pipetting tip is arranged, wherein, by moving the piston, aspirating and dispensing of pipetting liquid through the pipette tip is possible; and
an electric motor according to claim 10, wherein the driven moving portion is part of the piston or wherein the driven moving portion is drivingly coupled to the piston.

* * * * *